United States Patent
Hong et al.

(10) Patent No.: US 9,748,320 B2
(45) Date of Patent: Aug. 29, 2017

(54) THIN-FILM TRANSISTOR SUBSTRATE AND DISPLAY DEVICE COMPRISING THE SAME

(71) Applicant: LG DISPLAY CO., LTD., Seoul (KR)

(72) Inventors: Sungki Hong, Incheon (KR); Byungyong Ahn, Goyang-si (KR); Sangkug Han, Paju-si (KR); Seungmin Lee, Goyang-si (KR); Yujin Choi, Namyangju-si (KR); Sunghoon Hong, Incheon (KR); Youngwoon Yoon, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/197,351

(22) Filed: Jun. 29, 2016

(65) Prior Publication Data

US 2017/0005152 A1 Jan. 5, 2017

(30) Foreign Application Priority Data

Jun. 30, 2015 (KR) .................. 10-2015-0093180

(51) Int. Cl.
*H01L 27/32* (2006.01)
*H01L 29/786* (2006.01)
*H01L 27/12* (2006.01)

(52) U.S. Cl.
CPC ...... *H01L 27/3248* (2013.01); *H01L 27/1218* (2013.01); *H01L 27/1222* (2013.01); *H01L 29/78603* (2013.01); *H01L 29/78621* (2013.01); *H01L 29/78633* (2013.01); *H01L 29/78648* (2013.01); *H01L 27/3232* (2013.01); *H01L 27/3237* (2013.01); *H01L 29/78609* (2013.01)

(58) Field of Classification Search
CPC .................. H01L 27/3232; H01L 27/3272
USPC .......................... 257/98, 630, 508
See application file for complete search history.

(56) References Cited

U.S. PATENT DOCUMENTS

| | | | |
|---|---|---|---|
| 5,495,119 A | 2/1996 | Ikeuchi | |
| 5,807,772 A | 9/1998 | Takemura | |
| 6,252,248 B1 | 6/2001 | Sano et al. | |
| 2003/0025166 A1 | 2/2003 | Yamakazi et al. | |
| 2003/0143377 A1* | 7/2003 | Sano | G02F 1/133345 428/156 |
| 2007/0159565 A1* | 7/2007 | Segawa | G02F 1/136209 349/38 |
| 2007/0210303 A1* | 9/2007 | Ikeda | H01L 29/78633 257/40 |
| 2009/0020761 A1 | 1/2009 | Okazaki | |
| 2012/0256184 A1 | 10/2012 | Kaneko et al. | |

(Continued)

FOREIGN PATENT DOCUMENTS

EP 2120267 A1 11/2009

*Primary Examiner* — George Fourson, III
(74) *Attorney, Agent, or Firm* — Dentons US LLP

(57) ABSTRACT

A thin-film transistor substrate and a display device comprising the same are provided which can improve display quality by reducing or preventing deterioration of the characteristics of thin-film transistors. The thin-film transistor substrate comprises thin-film transistors on a lower protective metal layer. Each thin-film transistor comprises a buffer layer, a semiconductor layer, a first insulating film, a gate electrode, a second insulating film, a source electrode and a drain electrode, and a first electrode. The lower protective metal layer is electrically connected to the gate electrode and overlaps the channel region of the semiconductor layer.

14 Claims, 14 Drawing Sheets

(56) References Cited

U.S. PATENT DOCUMENTS

| | | | |
|---|---|---|---|
| 2015/0206931 A1* | 7/2015 | Choi | H01L 27/3272 257/72 |
| 2015/0379923 A1* | 12/2015 | Lee | G09G 3/3233 345/206 |
| 2016/0013259 A1* | 1/2016 | Yang | H01L 27/3272 257/40 |
| 2017/0062542 A1* | 3/2017 | Jung | H01L 27/3272 |

* cited by examiner

Increase in off current

THIN-FILM TRANSISTOR SUBSTRATE AND DISPLAY DEVICE COMPRISING THE SAME

This application claims the priority benefit of Korean Patent Application No. 10-2015-0093180 filed on Jun. 30, 2015, which is incorporated herein by reference for all purposes as if fully set forth herein.

BACKGROUND OF THE INVENTION

Field of the Invention

The present invention relates to a thin-film transistor substrate which can improve the characteristics of thin-film transistors and a display device comprising the same.

Discussion of the Related Art

With the development of information society, various demands for display devices for displaying images are on the rise. In the field of display devices, flat panel display devices (FPDs), which are thin, light, and can cover a large area, have been rapidly replacing bulky cathode ray tubes (CRTs). Flat panel display devices include liquid crystal display devices (LCDs), plasma display panels (PDPs), organic light-emitting display devices (OLEDs), electrophoretic display devices (EDs), etc.

Among these types of display devices, organic light-emitting displays are a self-luminous device, and have fast response time, high light emission efficiency, high luminance, and wide viewing angle. Especially, organic light-emitting displays, which take advantage of the characteristics of OLEDs with excellent energy efficiency, can be classified into passive-matrix organic light-emitting displays and active-matrix organic light-emitting displays. An active-matrix organic light-emitting display comprises a thin-film transistor substrate on which a plurality of pixel areas are arranged in a matrix, with each pixel having one or more thin film transistors.

Each thin-film transistor on the thin-film transistor substrate is formed on a substrate such that a semiconductor layer and a gate electrode face each other with a gate insulating film placed between them, and comprises a source electrode and a drain electrode that are connected to the semiconductor layer. Thin-film transistors are switched on/off by adjusting carriers moving to a channel in the semiconductor layer through the source and drain electrodes by tuning the voltage at the gate electrode. Accordingly, thin-film transistors are affected by surrounding voltages, static electricity, etc., which may change the characteristics of the thin-film transistors.

SUMMARY

The present invention is directed to a thin-film transistor substrate and a method of manufacturing the same that substantially obviate one or more of the problems due to limitations and disadvantages of the related art.

An advantage of the present invention is to provide a thin-film transistor substrate with improved characteristics of thin-film transistors and a display device comprising the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a thin-film transistor substrate may, for example, include a lower protective metal layer on a substrate, a buffer layer on the lower protective metal layer, a semiconductor layer on the buffer layer and comprising a channel region, lightly doped regions, a source region, and a drain region, a first insulating film on the semiconductor layer, a gate electrode on the first gate insulating film and electrically connected to the lower protective metal layer, a second insulating film on the gate electrode, source and drain electrodes on the second insulating film and electrically connected to the source and drain regions, and a first electrode electrically connected to the drain region, wherein the lower protective metal layer overlaps the channel region of the semiconductor layer.

The lower protective metal layer overlaps the channel region of the semiconductor layer and does not overlap the lightly doped regions.

The width of the lower protective metal layer is smaller than the width of the channel region of the semiconductor layer.

The lower protective metal layer overlaps the channel region and lightly doped regions of the semiconductor layer and does not overlap the source and drain regions.

The width of the lower protective metal layer is larger than the width of the channel region and smaller than the sum of the width of the channel region and the widths of the lightly doped regions.

In another aspect, a thin-film transistor substrate may, for example, include a lower protective metal layer on a substrate, a buffer layer on the lower protective metal layer, a semiconductor layer on the lower protective metal layer and comprising a channel region, lightly doped regions, a source region, and a drain region, a first insulating film on the semiconductor layer, a gate electrode on the first gate insulating film, a second insulating film on the gate electrode, a drain electrode on the second insulating film and electrically connected to the drain region, and a source electrode electrically connected to the source region and the lower protective metal layer, wherein the lower protective metal layer overlaps the channel region of the semiconductor layer.

The lower protective metal layer overlaps the channel region of the semiconductor layer and does not overlap the lightly doped regions.

The width of the lower protective metal layer is smaller than the width of the channel region of the semiconductor layer.

The lower protective metal layer overlaps the channel region and lightly doped regions of the semiconductor layer and does not overlap the source and drain regions.

The width of the lower protective metal layer is larger than the width of the channel region and smaller than the sum of the width of the channel region and the widths of the lightly doped regions.

The lower protective metal layer overlaps the channel region of the semiconductor layer, the lightly doped regions, the source region, and the drain region.

The width of the lower protective metal layer is smaller than the overall width of the semiconductor layer and larger than the sum of the width of the channel region and the widths of the lightly doped regions.

In another aspect, a thin-film transistor substrate may, for example, include a lower protective metal layer on a substrate, a buffer layer on the lower protective metal layer, a semiconductor layer on the buffer layer and comprising a channel region, lightly doped regions, a source region, and a drain region, a first insulating film on the semiconductor layer, a gate electrode on the first gate insulating film and electrically connected to the lower protective metal layer, a second insulating film on the gate electrode, source and drain electrodes on the second insulating film and electrically connected to the source and drain regions, a first electrode electrically connected to the drain region, an organic layer on the first electrode, and a second electrode on the organic layer, wherein the lower protective metal layer overlaps the channel region of the semiconductor layer.

In another aspect, a thin-film transistor substrate may, for example, include a lower protective metal layer on a substrate, a buffer layer on the lower protective metal layer, a semiconductor layer on the lower protective metal layer and comprising a channel region, lightly doped regions, a source region, and a drain region, a first insulating film on the semiconductor layer, a gate electrode on the first gate insulating film, a second insulating film on the gate electrode, a drain electrode on the second insulating film and electrically connected to the drain region, a source electrode electrically connected to the source region and the lower protective metal layer, an organic layer on the first electrode, and a second electrode on the organic layer, wherein the lower protective metal layer overlaps the channel region of the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
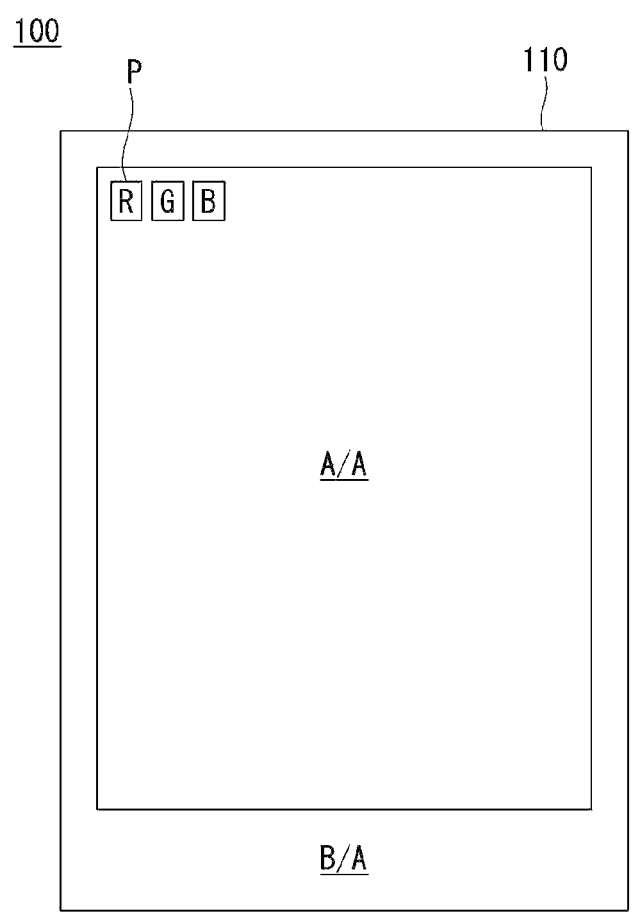
FIG. 1 is a top plan view illustrating an organic light-emitting display according to an embodiment of the present invention.

Hereinafter, exemplary embodiments of the present invention will be described in detail with reference to the accompanying drawings. Throughout the specification, the same reference numerals indicate substantially the same components. In describing the present invention, when it is deemed that a detailed description of known functions or configurations may unnecessarily obscure the subject matter of the present invention, the detailed description will be omitted. Also, the terms for the elements to be used in the following description may be different from those for the parts of actual products since they may be chosen for the ease of writing the specification.

Hereinafter, an exemplary embodiment of the present invention will be described with reference to the accompanying drawings.

In a thin-film transistor substrate according to an embodiment of the present invention, a semiconductor layer is formed of polycrystalline semiconductor material or oxide semiconductor material. The polycrystalline semiconductor material has high mobility (greater than 100 $cm^2/Vs$), low energy power consumption and excellent reliability. Thus, it may be adapted to a gate driver and/or multiplexer (MUX) for use in a driving device for driving thin-film transistors. Also, it may be adapted to driving thin-film transistors within pixels in an organic light-emitting display. Because of its low off current, the oxide semiconductor material is suitable for switching thin-film transistors which remain on for a short time and off for a long time. Also, the oxide semiconductor material is suitable for display devices, which typically require fast driving and/or low power consumption, because the voltage sustaining period of pixels is long due to the low off current. An embodiment of the present invention will be described by taking a driving thin-film transistor comprising a polycrystalline semiconductor material as an example. However, the present invention is not limited to this example, but may be used for a switching thin-film transistor, etc.

FIG. 1 is a top plan view showing an organic light-emitting display according to an embodiment of the present invention.

Referring to FIG. 1, an organic light-emitting display according to an exemplary embodiment of the present invention comprises an active area A/A that displays an image on a substrate 110, and a bezel area B/A surrounding the active area A/A.

In the active area A/A, a plurality of pixels P are disposed and emit light of red (R), green (G), and blue (B) to produce full-color images. Although this exemplary embodiment illustrates red, green, and blue pixels, a white (W) pixel may be further provided. Also, the pixels P may include cyan, magenta, and yellow pixels, and any well-known pixel elements may be applicable. Moreover, although this exemplary embodiment illustrates a stripe pattern in which red (R), green (G), and blue (B) pixels are sequentially arranged in one row, the red (R), green (G), and blue (B) pixels may be arranged in three consecutive rows or in a pentile pattern. The bezel area B/A is an area surrounding the active area A/A, which emits no light. The bezel area B/A may comprise a gate driver, a data driver, etc. for use in a driving device for driving the pixels in the active area A/A.

Hereinafter, an organic light-emitting display according to a first exemplary embodiment of the present invention will be described with reference to FIGS. 2 through 4. In what follows, a pixel of the organic light-emitting display will be explained by way of example.

First Exemplary Embodiment

Figure 2:
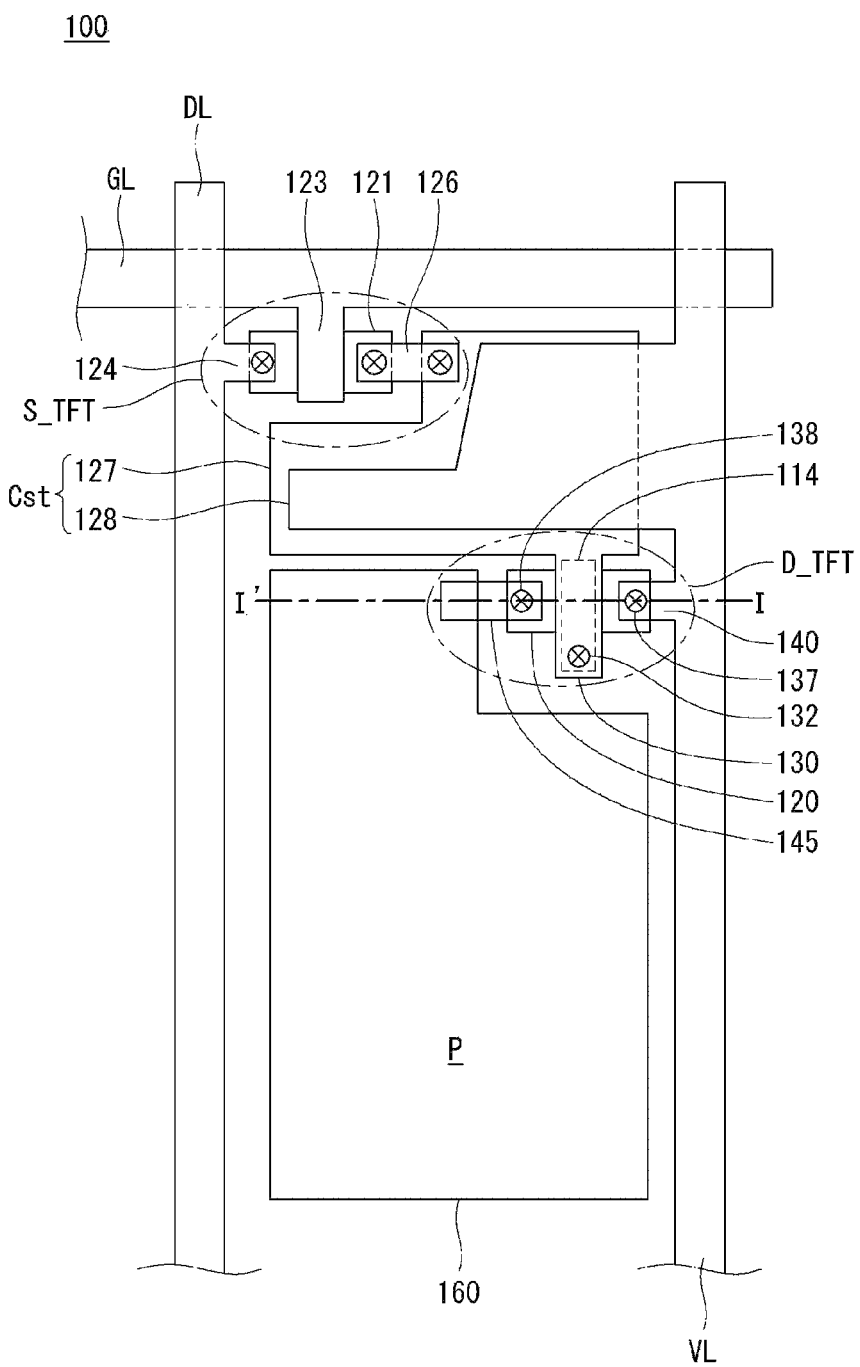
FIG. 2 is a top plan view showing a pixel of FIG. 1.

FIG. 2 is a top plan view showing a pixel of FIG. 1. FIGS. 3 and 4 are cross-sectional views showing various structures taken along the line I-I' of FIG. 2.

Referring to FIG. 2, in an organic light-emitting display 100 according to a first exemplary embodiment of the present invention, a pixel region P is defined by disposing a gate line GL and a data line DL and power supply line VL intersecting the gate line GL on a substrate 110. The pixel region P indicates an internal area which is defined by the intersection of the gate line GL, the data line DL, and the power supply line VL. Although no gate lines are shown below the pixel region P in the drawings, the pixel region P may be defined because there is a gate line for a neighboring pixel.

In the pixel region P, a switching TFT S_TFT, a driving TFT D_TFT, a capacitor Cst, and an organic light-emitting diode (not shown) connected to the driving TFT D_TFT are disposed. The switching TFT S_TFT functions to select a pixel. The switching TFT S_TFT comprises a semiconductor layer 121, a gate electrode 123 branched from the gate line GL, a source electrode 124 branched from the data line DL, and a drain electrode 126. The capacitor Cst comprises a capacitor lower electrode 127 connected to the drain electrode 126 of the switching TFT S_TFT and a capacitor upper electrode 128 connected to the power supply line VL. The driving TFT D_TFT serves to drive the first electrode of the pixel selected by the switching TFT S_TFT. The driving TFT D_TFT comprises a semiconductor layer 120, a gate electrode 130 connected to the capacitor lower electrode 127, a source electrode 140 branched from the power supply line VL, and a drain electrode 145. The organic light-emitting diode (not shown) comprises a first electrode 160 connected to the drain electrode 145 of the driving TFT D_TFT, an organic layer (not shown) comprising a light-emitting layer formed on the first electrode 160, and a second electrode (not shown). Also, a lower protective metal layer 114 connected to the gate electrode 130 via a contact hole 132 is positioned under the semiconductor layer 120 of the driving TFT D_TFT.

Hereinafter, a description will be made with reference to FIG. 3, which is a cross-sectional view showing a structure taken along the line I-I' of FIG. 2.

Figure 3:
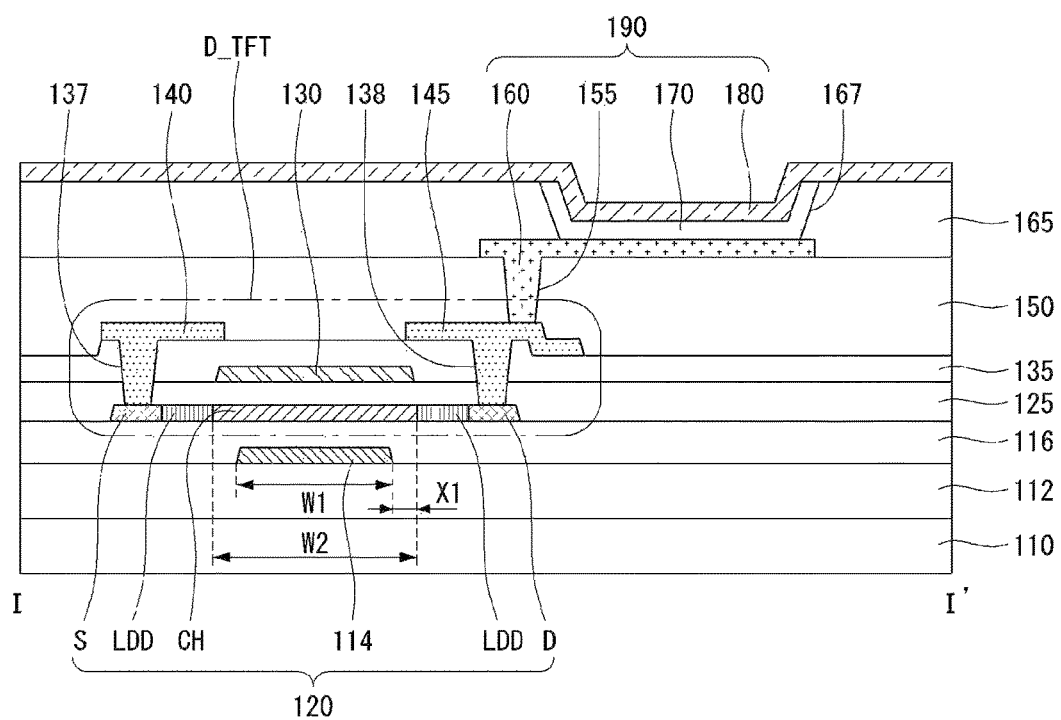
FIGS. 3 and 4 are cross-sectional views showing various structures taken along the line I-I' of FIG. 2.

Referring to FIG. 3, the organic light-emitting display 100 according to the first exemplary embodiment of the present invention comprises a substrate 110, a driving TFT 150, and an organic light-emitting diode 190 connected to the driving TFT 150 that are positioned on the substrate 110.

More specifically, the substrate 110 is formed of glass, plastic, metal, etc. In an embodiment of the present invention, the substrate 110 consists of plastic. Specifically, the substrate 110 may be a polyimide substrate. Accordingly, the substrate 110 is flexible. A first buffer layer 112 is positioned on the substrate 110. The first buffer layer 112 serves to protect thin-film transistors, which are to be formed in a subsequent process, from impurities such as alkali ions leaking out from the substrate 110. The first buffer layer 112 may be formed of silicon oxide (SiOx), silicon nitride (SiNx), or multiple layers of silicon oxide (SiOx) and silicon nitride (SiNx).

The lower protective metal layer 114 is positioned on the first buffer layer 122. The lower protective metal layer 114 serves to prevent a reduction in panel driving current which may occur from the use of the polyimide substrate. The lower protective metal layer 114 may form of a conductive material, including a semiconductor such as silicon (Si) or a metal. A second buffer layer 116 is positioned on the lower protective metal layer 114. The second buffer layer 116 serves to protect thin-film transistors, which are to be formed in a subsequent process, from impurities such as alkali ions leaking out from the lower protective metal layer 114. The second buffer layer 116 may form of silicon oxide (SiOx), silicon nitride (SiNx), or multiple layers of silicon oxide (SiOx) and silicon nitride (SiNx).

The semiconductor layer 120 is positioned on the second buffer layer 116. The semiconductor layer 120 may form of a silicon semiconductor or an oxide semiconductor. The silicon semiconductor may comprise amorphous silicon or crystallized polycrystalline silicon. In this exemplary embodiment, the semiconductor layer 120 may form of polycrystalline silicon. The semiconductor layer 120 comprises a source region S, a drain region D, lightly doped regions LDD, and a channel region CH placed between these regions. The source region S and the drain region D are regions which are doped with a high concentration of impurities, in which the source and drain electrodes of a thin-film transistor are connected, respectively. The lightly doped regions LDD are regions which are doped with a lower concentration of impurities than the source and drain regions S and D and positioned between the channel region CH and the source and drain regions S and D. The channel region CH is positioned between the lightly doped regions LDD, and acts as a passage through which carriers in the semiconductor layer 120 pass. Here, the impurity ions may be p-type impurities or n-type impurities. The p-type impurities may be selected from the group forming of boron (B), aluminum (Al), gallium (Ga), and indium (In), and the n-type impurities may be selected from the group forming of phosphorous (P), arsenic (As), and antimony (Sb).

A first insulating film 125 that may serve as a gate insulating film is positioned on the semiconductor layer 120. The first insulating film 125 may be composed of silicon oxide (SiOx), silicon nitride (SiNx), or multiple layers of silicon oxide (SiOx) and silicon nitride (SiNx). The gate electrode 130 is positioned on the first insulating film 125, corresponding to a certain part of the semiconductor layer 120, i.e., the channel region CH. The gate electrode 130 is formed of any one selected from the group forming of molybdenum (Mo), aluminum (Al), chrome (Cr), gold (Au), titanium (Ti), nickel (Ni), neodymium (Nd), and copper (Cu), or an alloy of these elements. Also, the gate electrode 130 may be multiple layers formed of any one selected from the group forming of molybdenum (Mo), aluminum (Al), chrome (Cr), gold (Au), titanium (Ti), nickel (Ni), neodymium (Nd), and copper (Cu), or an alloy of these elements. For example, the gate electrode 130 may be a dual layer of molybdenum/aluminum-neodymium or molybdenum/aluminum.

A second insulating film 135 that may serve as an interlayer insulating film is positioned on the gate electrode 130. The second insulating film 135 may be composed of silicon oxide (SiOx), silicon nitride (SiNx), or multiple layers of silicon oxide (SiOx) and silicon nitride (SiNx). Parts of the first and second insulating films 125 and 135 are etched to form contact holes 137 and 138 exposing part of the semiconductor layer 120, i.e., the source and drain regions S and D. A source electrode 140 and a drain electrode 145 are formed, which are electrically connected to the semiconductor layer 120 via the contact holes 137 and 138 penetrating the second insulating film 135 and the first insulating film 125. The source electrode 140 and the drain electrode 145 may have a single layer structure or multilayer structure. If the source electrode 140 and the drain electrode 145 have a single layer structure, they may be formed of any one selected from the group forming of molybdenum (Mo), aluminum (Al), chrome (Cr), gold (Au), titanium (Ti), nickel (Ni), neodymium (Nd), and copper (Cu), or an alloy of these elements. If the source electrode 140 and the drain electrode 145 have a multilayer structure, they may form of two layers of molybdenum/aluminum-neodymium or three layers of titanium/aluminum/titanium, molybdenum/aluminum/molybdenum, or molybdenum/aluminum-neodymium/molybdenum. Accordingly, a driving TFT D_DFT comprising the semiconductor layer 120, gate electrode 130, source electrode 140, and drain electrode 145 is configured.

A third insulating film 150 is positioned over the entire surface of the substrate 110 comprising the driving TFT D_TFT. The third insulating film 150 may be a planarization film for alleviating differences in level in the underlying structure, and may be formed of an organic material such as polyimide, benzocyclobutene-based resin, acrylate, etc. The third insulating film 150 may be formed by a method such as SOG (spin on glass) by which the organic material is coated in liquid form and hardened. The third insulating film 150 comprises a via hole 155 that exposes the drain electrode 145 of the driving TFT D_TFT.

A first electrode 160 is positioned on the third insulating film 150. The first electrode 160 may be an anode, and formed of a transparent conductive material, for example, ITO (indium tin oxide), IZO (indium zinc oxide), or ZnO (zinc oxide). The first electrode 160 fills the via hole 155, and is connected to the drain electrode 145 of the driving TFT D_TFT. Here, if the display device 100 is a top-emission device that emits light in the direction of the second electrode 180, the first electrode 160 further comprises a reflective layer, thus forming a two-layer structure of ITO and a reflective layer or a three-layer structure of ITO, a reflective layer, and ITO. On the other hand, if the display device 100 is a bottom-emission device that emits light in the direction of the first electrode 160, the first electrode 160 may be formed solely of a transparent conductive material.

A bank layer 165 is positioned on the substrate 110 comprising the first electrode 160. The bank layer 165 may be a pixel defining layer that defines a pixel by partially exposing the first electrode 160. The bank layer 165 is formed of an organic material such as polyimide, benzocyclobutene-based resin resin, acrylate, etc. The bank layer 165 has an opening 167 exposing the first electrode 160.

An organic layer 170 is positioned on the first electrode 160 that is exposed by the opening 167 of the bank layer 165. The organic layer 170 is a layer that emits light by the recombination of electrons and holes. A hole injection layer or hole transport layer may be formed between the organic layer 170 and the first electrode 160, and an electron transport layer or electron injection layer may be formed on the organic layer 170.

A second electrode 180 is positioned on the substrate 110 where the organic layer 170 is formed. The second electrode 180 is a cathode, and may be composed of magnesium (Mg), calcium (Ca), aluminum (Al), silver (Ag), or an alloy of these elements, having a low work function. If the display device 100 is a top-emission device that emits light in the direction of the second electrode 180, the second electrode 180 may be formed thin enough to pass light therethrough. On the other hand, if the display device 100 is a bottom-emission device that emits light in the direction of the first electrode 160, the second electrode 180 may be formed thick enough to reflect light. Accordingly, the display device 100 according to the first exemplary embodiment of the present invention is configured.

As illustrated in FIG. 3, in the display device 100 according to the first exemplary embodiment of the present invention, the lower protective metal layer 114 is positioned under the semiconductor layer 120 of the driving TFT D_TFT. The gate electrode 130 is connected to the lower protective metal layer 114 via the contact hole (indicated by reference numeral 132 of FIG. 2) that penetrates the second buffer layer 116 and the first insulating film 125 and exposes the lower protective metal layer 114. That is, a thin-film transistor according to this exemplary embodiment discloses a connecting structure between the gate electrode 130 and the lower protective metal layer 114. When the gate electrode 130 is connected to the lower protective metal layer 114 and a gate voltage is applied to the lower protective metal layer 114, the difference in horizontal energy field (E-field) between the drain region D and channel region CH of the semiconductor layer 120 may be alleviated. This prevents hot-carrier generation, which is a phenomenon where electrons flow to the interface or first insulating film 125 of the semiconductor layer 120, thereby preventing reductions in the electron mobility and on current of the thin-film transistor. Besides, the off current may be reduced when the thin-film transistor is switched off.

The lower protective metal layer 114 is positioned to overlap the channel region CH of the semiconductor layer 120 and to not overlap the lightly doped regions LDD. Accordingly, the width W1 of the lower protective metal layer 114 is smaller than the width W2 of the channel region CH of the semiconductor layer 120. Here, if the width W1 of the lower protective metal layer 114 is smaller than the width W2 of the channel region CH of the semiconductor layer 120, this offers the advantage of alleviating the difference in horizontal energy field between the drain region D and the channel region CH, thereby preventing hot-carrier generation and reducing the off current. Also, if the width W1 of the lower protective metal layer 114 increases enough to make it close to the source region S or drain region D of the semiconductor layer 120, more hot carriers may be produced in the semiconductor layer 120. Accordingly, in this exemplary embodiment of the present invention, the width W1 of the lower protective metal layer 114 is smaller than the width W2 of the channel region CH of the semiconductor layer 120.

As opposed to the above-mentioned FIG. 3, with the connecting structure between the gate electrode 130 and the lower protective metal layer 114, the width W1 of the lower protective metal layer 114 may be larger than the width W2 of the channel region CH of the semiconductor layer 120.

Figure 4:
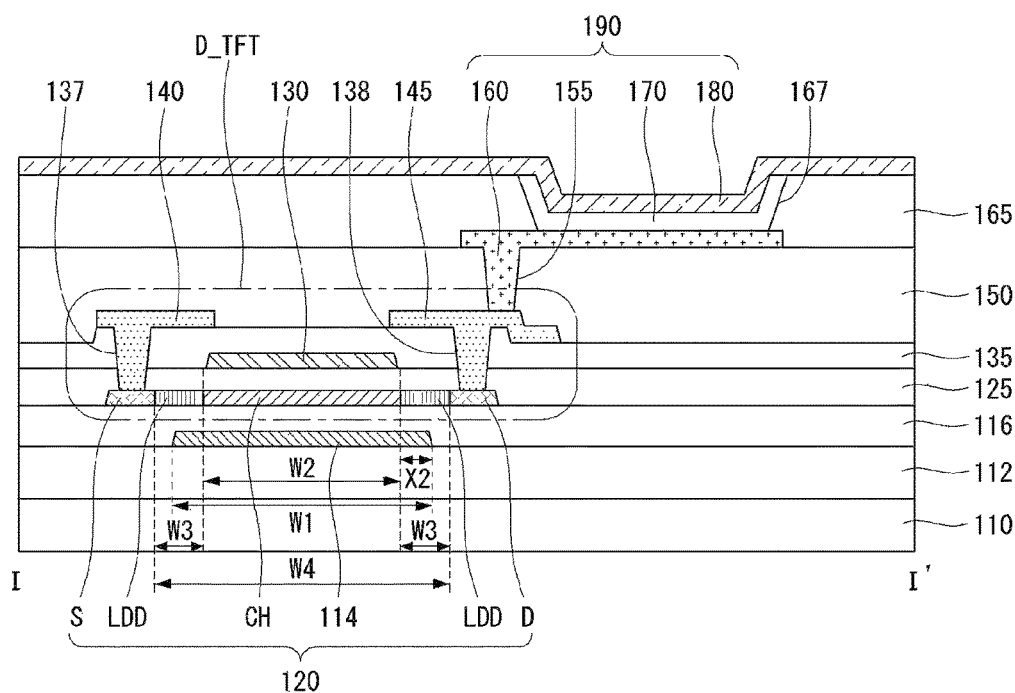

Referring to FIG. 4, the lower protective metal layer 114 is positioned to overlap the channel region CH and lightly doped regions LDD of the semiconductor layer 120. Accordingly, the width W1 of the lower protective metal layer 114 may be larger than the width W2 of the channel region CH of the semiconductor layer 120 but smaller than the width W4, which equals the sum of the width W2 of the channel region CH and the widths W3 of the lightly doped regions LDD. In this case, because the connecting structure between the gate electrode 130 and the lower protective metal layer 114 has a strong horizontal energy field induced by a back channel, this greatly affects the horizontal energy field in the drain region D and a front channel of the channel region CH. As such, if the width W1 of the lower protective metal layer 114 is large, this inhibits the role of the lightly doped regions LDD. Accordingly, if the width W1 of the lower protective metal layer 114 is larger than the width W2 of the channel region CH, this prevents current leakage caused by an optical current generated when external light enters the channel region CH. On the contrary, if the width W1 of the lower protective metal layer 114 is smaller than the width W4, which equals the sum of the width W2 of the channel region CH and the widths W3 of the lightly doped regions LDD, this prevents an off current increase and hot-carrier generation when the width W1 of the lower protective metal layer 114 covers the lightly doped regions LDD. As such, if the width W1 of the lower protective metal layer 114 is larger than the width 2 of the channel region CH of the semiconductor layer 120 but smaller than the width W4, which equals the sum of the width W2 of the channel region CH and the widths W3 of the lightly doped regions LDD, this offers the advantage of reducing the off current of the thin-film transistor and reducing hot-carrier generation, thereby improving the quality of the display device.

Hereinafter, an organic light-emitting display according to a second exemplary embodiment of the present invention will be described with reference to FIGS. 5 through 8. In what follows, a pixel of the organic light-emitting display will be explained by way of example. In what follows, the same components as the first exemplary embodiment will be denoted by the same reference numerals for better comprehension and ease of description.

Second Exemplary Embodiment

Figure 5:
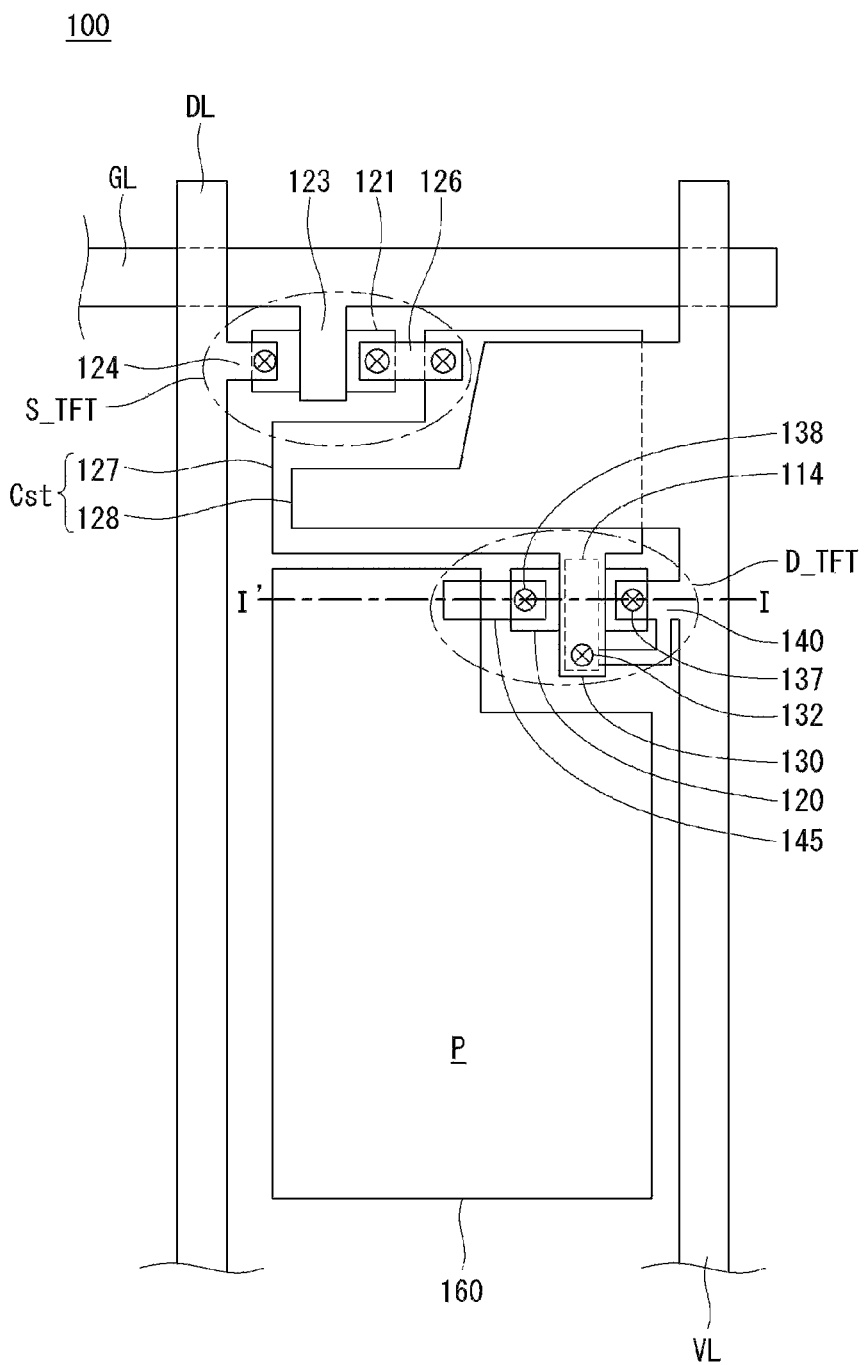
FIG. 5 is a top plan view showing a pixel of FIG. 1.
Figure 6:
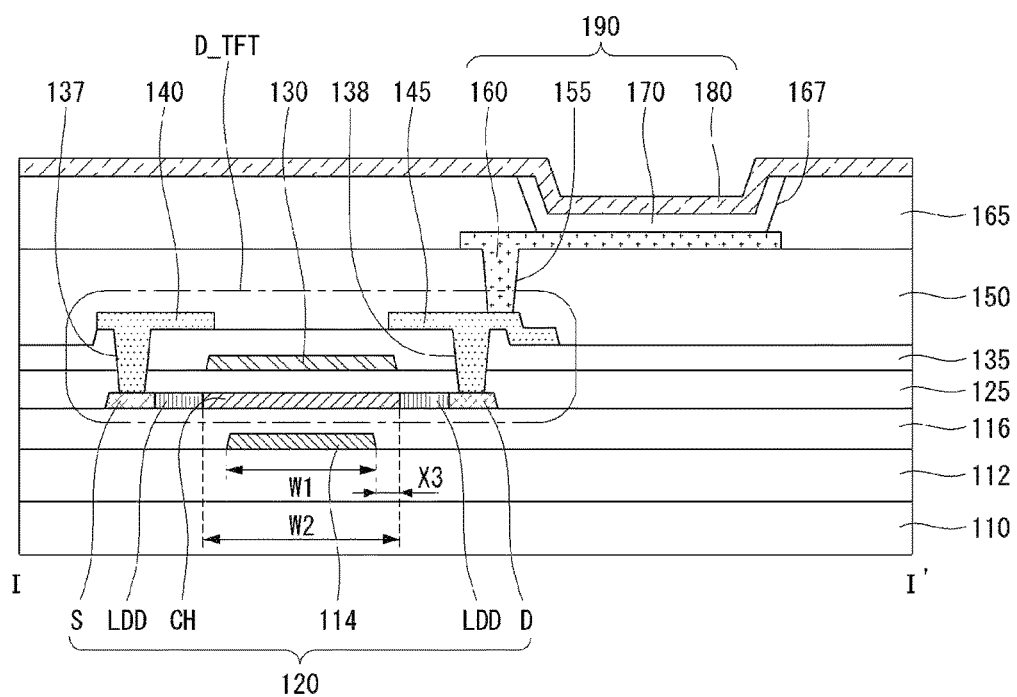
FIGS. 6 to 8 are cross-sectional views showing various structures taken along the line II-II' of FIG. 5.
Figure 7:
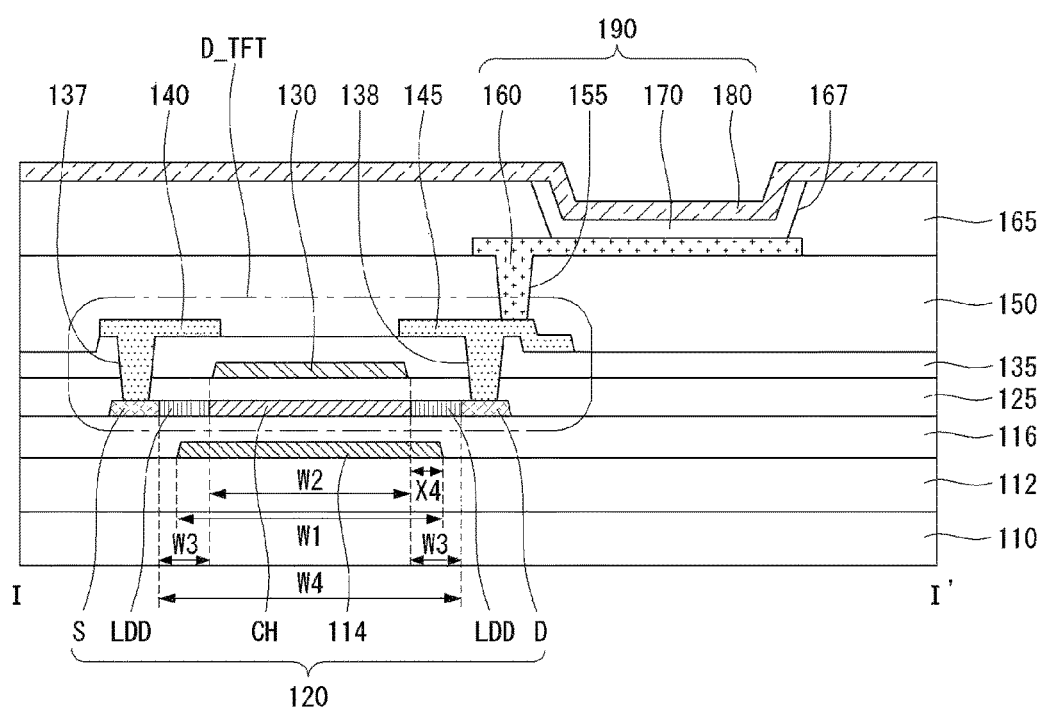
Figure 8:
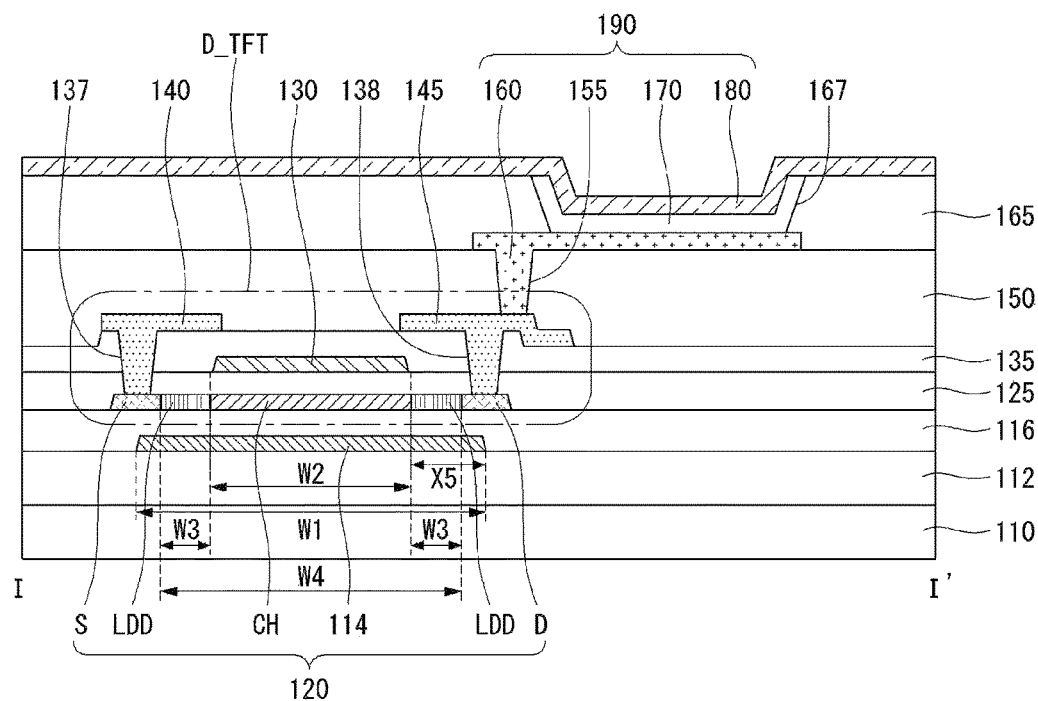

FIG. 5 is a top plan view showing a pixel of FIG. 1. FIGS. 6 to 8 are cross-sectional views showing various structures taken along the line II-II' of FIG. 5.

Referring to FIG. 5, in an organic light-emitting display 100 according to a second exemplary embodiment of the present invention, a pixel region P is defined by disposing a gate line GL and a data line DL and a power supply line VL intersecting the gate line GL on a substrate 110. In the pixel region P, a switching TFT S_TFT, a driving TFT D_TFT, a capacitor Cst, and an organic light-emitting diode (not shown) connected to the driving TFT D_TFT are disposed. The switching TFT S_TFT comprises a semiconductor layer 121, a gate electrode 123 branched from the gate line GL, a source electrode 124 branched from the data line DL, and a drain electrode 126. The capacitor Cst comprises a capacitor lower electrode 127 connected to the drain electrode 126 of the switching TFT S_TFT and a capacitor upper electrode 128 connected to the power supply line VL. The driving TFT D_TFT comprises a semiconductor layer 120, a gate electrode 130 connected to the capacitor lower electrode 127, a source electrode branched from the power supply line VL, and a drain electrode 145. The organic light-emitting diode (not shown) comprises a first electrode 160 connected to the drain electrode 145 of the driving TFT D_TFT, an organic layer (not shown) comprising a light-emitting layer formed on the first electrode 160, and a second electrode (not shown). Also, a lower protective metal layer 114 connected to the gate electrode 130 via a contact hole 132 is positioned under the semiconductor layer 120 of the driving TFT D_TFT. Here, a wiring line branched and extending from the source electrode 140 is connected to the lower protective metal layer 114 via a contact hole 132. Although FIG. 5 illustrates that a wiring line is branched and extends between the source electrode 140 and the first electrode 160, the wiring line is not specifically limited to this example and may extend in other directions.

Hereinafter, a detailed description will be made with reference to cross-sectional views taken along the line II-II' of FIG. 5.

Referring to FIG. 5, the organic light-emitting display 100 according to the second exemplary embodiment of the present invention comprises a substrate 110, a driving TFT 150, and an organic light-emitting diode 190 connected to the driving TFT 150.

More specifically, a first buffer layer 112 is positioned on the substrate 110, and the lower protective metal layer 114 is positioned on the first buffer layer 112. The lower protective metal layer 114 serves to prevent a reduction in panel driving current which may occur from the use of the polyimide substrate. A second buffer layer 116 is positioned on the lower protective metal layer 114, and the semiconductor layer 120 is positioned on the second buffer layer 116. The semiconductor layer 120 comprises a source region S, a drain region D, lightly doped regions LDD, and a channel region CH placed between these regions.

A first insulating film 125 is positioned on the semiconductor layer 120, and the gate electrode 130 is positioned on the first insulating film 125, corresponding to the channel region CH of the semiconductor layer 120. A second insulating film 135 is positioned on the gate electrode 130, and parts of the first and second insulating films 125 and 135 are etched to form contact holes 137 and 138 exposing parts of the semiconductor layer 120, i.e., the source and drain regions S and D. A source electrode 140 and a drain electrode 145 are formed, which are electrically connected to the semiconductor layer 120 via the contact holes 137 and 138 penetrating the second insulating film 135 and the first insulating film 125. Accordingly, a driving TFT D_DFT comprising the semiconductor layer 120, gate electrode 130, source electrode 140, and drain electrode 145 is configured.

A third insulating film 150 is positioned over the entire surface of the substrate 110 comprising the driving TFT D_TFT, and the third insulating film 150 comprises a via hole 155 that exposes the drain electrode 145 of the driving TFT D_TFT. The first electrode 160 is positioned on the third insulating film 150, and a bank layer 165 is positioned on the substrate 110 comprising the first electrode 160. The bank layer 165 has an opening 167 exposing the first electrode 160. An organic layer 170 is positioned on the first electrode 160 that is exposed by the opening 167 of the bank layer 165, and a second electrode 180 is positioned on the substrate 110 where the organic layer 170 is formed. Accordingly, the display device 100 according to the second exemplary embodiment of the present invention is configured.

As illustrated in FIG. 6, in the display device 100 according to the second exemplary embodiment of the present invention, an lower protective metal layer 114 is positioned under the semiconductor layer 120 of the driving TFT D_TFT. The source electrode 140 is connected to the lower protective metal layer 114 via the contact hole (indicated by reference numeral 132 of FIG. 5) that penetrates the second buffer layer 116, the first insulating film 125, and the second insulating film 135 and exposes the lower protective metal layer 114. That is, a thin-film transistor according to the second exemplary embodiment of the present invention discloses a connecting structure between the source electrode 140 and the lower protective metal layer 114. When the source electrode 140 is connected to the lower protective metal layer 114 and a source voltage is applied to the lower protective metal layer 114, the difference in horizontal energy field (E-field) between the drain region D and channel region CH of the semiconductor layer 120 may be alleviated. This prevents hot-carrier generation in the thin-film transistor and reduces the off current when the thin-film transistor is switched off.

As illustrated in FIG. 6, the lower protective metal layer 114 according to the second exemplary embodiment of the present invention is positioned to overlap the channel region CH of the semiconductor layer 120 and to not overlap the lightly doped regions LDD. Accordingly, the width W1 of the lower protective metal layer 114 according to the second exemplary embodiment of the present invention is smaller than the width W2 of the channel region CH of the semiconductor layer 120. Here, if the width W1 of the lower protective metal layer 114 is smaller than the width W2 of the channel region CH of the semiconductor layer 120, this offers the advantage of alleviating the difference in horizontal energy field between the drain region D and the channel region CH, thereby preventing hot-carrier generation and reducing the off current. Also, if the width W1 of the lower protective metal layer 114 increases enough to make it close to the source region S or drain region D of the semiconductor layer 120, more hot carriers may be produced in the semiconductor layer 120. Accordingly, in this exemplary embodiment of the present invention, the width W1 of the lower protective metal layer 114 is smaller than the width W2 of the channel region CH of the semiconductor layer 120.

As opposed to the above-mentioned FIG. 6, with the connecting structure between the source electrode 140 and the lower protective metal layer 114, the width W1 of the lower protective metal layer 114 may be larger than the width W2 of the channel region CH of the semiconductor layer 120.

Referring to FIG. 7, the lower protective metal layer 114 is positioned to overlap the channel region CH and lightly doped regions LDD of the semiconductor layer 120 and to not overlap the source and drain regions S and D. Accordingly, the width W1 of the lower protective metal layer 114 may be larger than the width W2 of the channel region CH of the semiconductor layer 120 but smaller than the width W4, which equals the sum of the width W2 of the channel region CH and the widths W3 of the lightly doped regions LDD. In this case, because the horizontal energy field induced by a back channel is weak in the connecting structure between the source electrode 140 and the lower protective metal layer 114, as opposed to the above-described connecting structure between the gate electrode 130 and the lower protective metal layer 114, this hardly affects the horizontal energy field in the drain region D and a front channel of the channel region CH. As such, even if the width W1 of the lower protective metal layer 114 is large, this does not inhibit the role of the lightly doped regions LDD.

Accordingly, if the width W1 of the lower protective metal layer 114 is larger than the width W2 of the channel region CH, this prevents current leakage caused by an optical current generated when external light enters the channel region CH. On the contrary, if the width W1 of the lower protective metal layer 114 is smaller than the width W4, which equals the sum of the width W2 of the channel region CH and the widths W3 of the lightly doped regions LDD, this prevents an off current increase and hot-carrier generation even if the width W1 of the lower protective metal layer 114 covers the lightly doped regions LDD. As such, if the width W1 of the lower protective metal layer 114 is larger than the width 2 of the channel region CH of the semiconductor layer 120 but smaller than the width W4, which equals the sum of the width W2 of the channel region CH and the widths W3 of the lightly doped regions LDD, this offers the advantage of reducing the off current of the thin-film transistor and reducing hot-carrier generation, thereby improving the quality of the display device.

As opposed to the above-mentioned FIGS. 6 and 7, with the connecting structure between the source electrode 140 and the lower protective metal layer 114, the width W1 of the lower protective metal layer 114 may be larger than the width W4, which equals the sum of the width W2 of the channel region CH and the widths W3 of the lightly doped regions LDD.

Referring to FIG. 8, the lower protective metal layer 114 is positioned to overlap the channel region CH, lightly doped regions LDD, and source and drain regions S and D of the semiconductor layer 120, and has a smaller width than the semiconductor layer 120.

The width W1 of the lower protective metal layer 114 is larger than the width W4, which equals the sum of the width W2 of the channel region CH and the widths W3 of the lightly doped regions LDD, but smaller than the width of the semiconductor layer 120. As described above, because the horizontal energy field induced by a back channel is weak in the connecting structure between the source electrode 140 and the lower protective metal layer 114, as opposed to the above-described connecting structure between the gate electrode 130 and the lower protective metal layer 114, this hardly affects the horizontal energy field in the drain region D and a front channel of the channel region CH. As such, even if the width W1 of the lower protective metal layer 114 is large, this does not inhibit the role of the lightly doped regions LDD. Accordingly, even if the width W1 of the lower protective metal layer 114 is larger than the width W4, which equals the sum of the width W2 of the channel region CH and the widths W3 of the lightly doped regions LDD, this does not lead to an increase in the off current of the thin-film transistor or hot-carrier generation. Still, the width W1 of the lower protective metal layer 114 is smaller than the width of the semiconductor layer 120, thereby preventing parasitic capacitance between the lower protective metal layer 114 and the source and drain electrodes 140 and 150.

As such, if the width W1 of the lower protective metal layer 114 is larger than the width W4, which equals the sum of the width W2 of the channel region CH and the widths W3 of the lightly doped regions LDD, but smaller than the width of the semiconductor layer 120, this offers the advantage of reducing the off current of the thin-film transistor and reducing hot-carrier generation, thereby improving the quality of the display device.

Below are test examples for measuring the characteristics of thin-film transistors in a display device fabricated according to the foregoing first and second exemplary embodiments of the present invention. The following test examples are merely examples of the present invention and the present invention is not limited thereto.

Test 1: Measurement of Characteristics of Thin-Film Transistor with Connecting Structure Between Gate Electrode and Lower Protective Metal Layer Example 1

A thin-film transistor with the structure of FIG. 4 was fabricated. Here, the overlap distance X2 between the lower protective metal layer and the lightly doped regions was 1.5 µm, and the width W3 of each lightly doped region was 1 µm.

Example 2

A thin-film transistor with the structure of FIG. 4 was fabricated. Here, the overlap distance X2 between the lower protective metal layer and the lightly doped regions was 1 µm, and the width W3 of each lightly doped region was 1.5 µm.

Example 3

A thin-film transistor with the structure of FIG. 4 in which the width of the lower protective overlaps the source and drain regions was fabricated. Here, the overlap distance (not shown) between the lower protective metal layer and the lightly doped regions and source region was 2 µm, and the width W3 of each lightly doped region was 1 µm.

Figure 9:
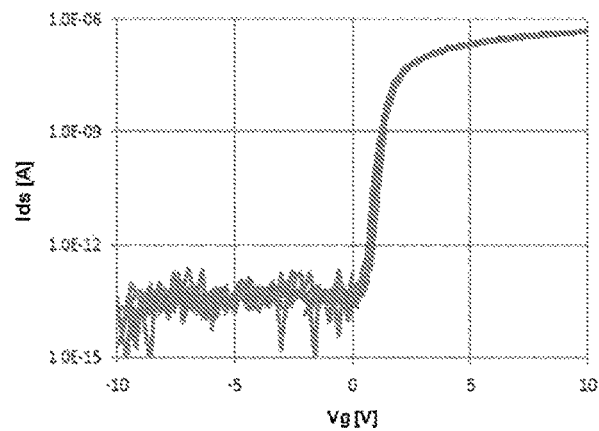
FIG. 9 is a graph of the source-drain current Ids versus gate voltage Vg which is measured upon application of a voltage of 0.1 V to the source and drain electrodes of a thin-film transistor fabricated according to Example 1 of the present invention.
Figure 10:
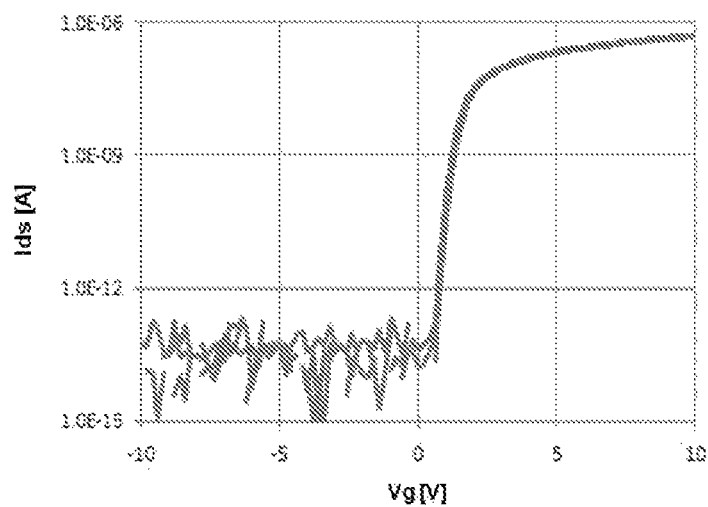
FIG. 10 is a graph of the source-drain current Ids versus gate voltage Vg which is measured upon application of a voltage of 0.1 V to the source and drain electrodes of a thin-film transistor fabricated according to Example 2 of the present invention.
Figure 11:
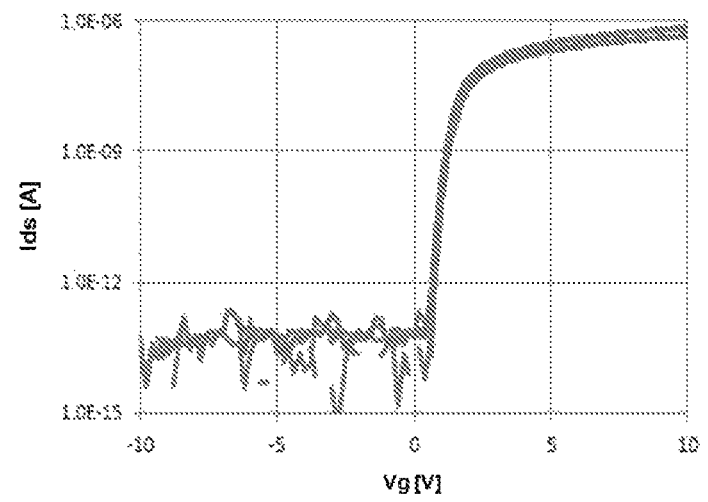
FIG. 11 is a graph of the source-drain current Ids versus gate voltage Vg which is measured upon application of a voltage of 0.1 V to the source and drain electrodes of a thin-film transistor fabricated according to Example 3 of the present invention.
Figure 12:
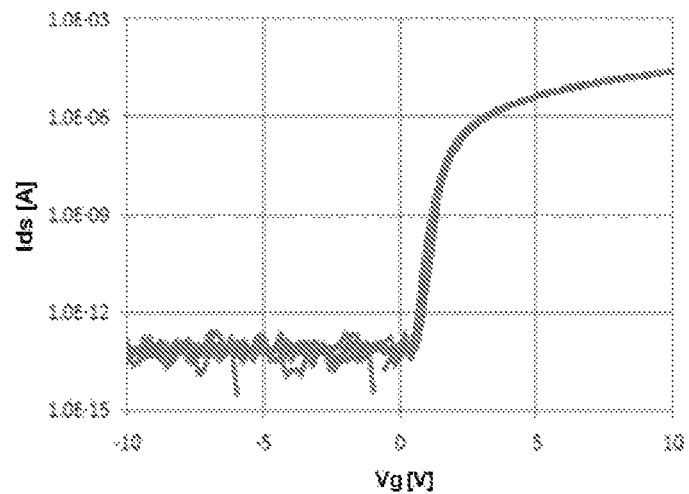
FIG. 12 is a graph of the source-drain current Ids versus gate voltage Vg which is measured upon application of a voltage of 10 V to the source and drain electrodes of a thin-film transistor fabricated according to Example 1 of the present invention.
Figure 13:
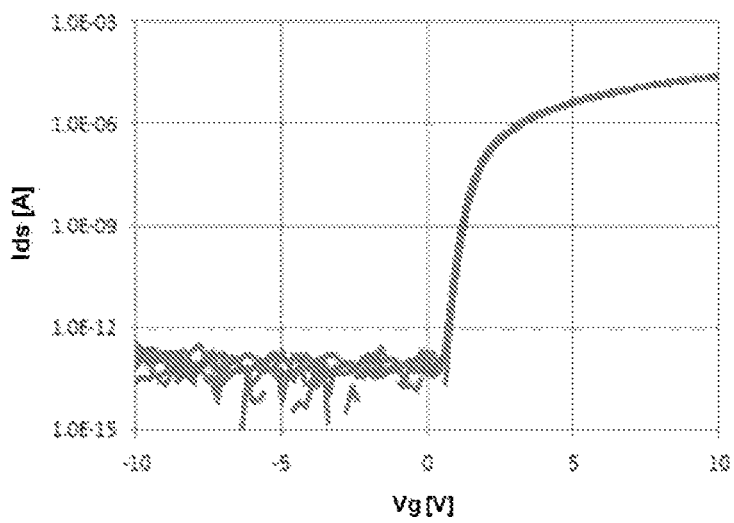
FIG. 13 is a graph of the source-drain current Ids versus gate voltage Vg which is measured upon application of a voltage of 10 V to the source and drain electrodes of a thin-film transistor fabricated according to Example 2 of the present invention.
Figure 14:
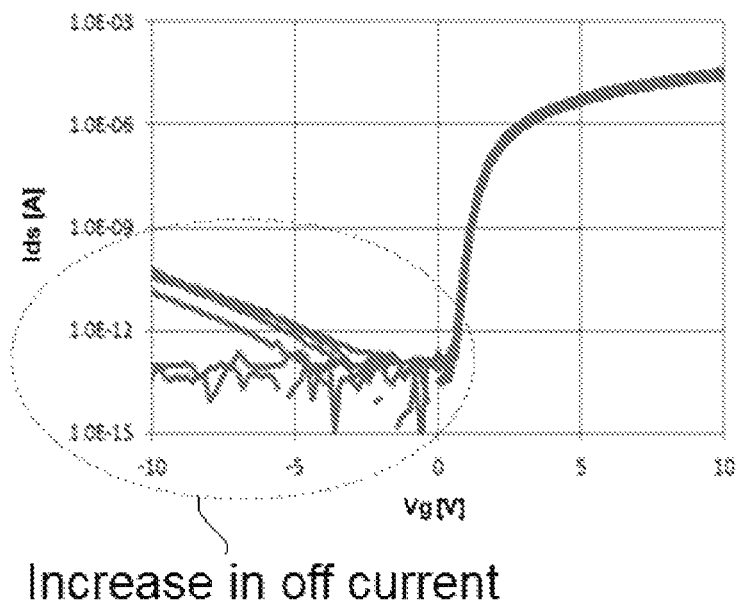
FIG. 14 is a graph of the source-drain current Ids versus gate voltage Vg which is measured upon application of a voltage of 10 V to the source and drain electrodes of a thin-film transistor fabricated according to Example 3 of the present invention.

In the thin-film transistors fabricated according to the aforementioned Examples 1 through 3, a voltage of 0.1 V was applied to the source and drain electrodes and the source-drain current Ids versus gate voltage Vg was measured and shown in FIGS. 9, 10, and 11, and a voltage of 10 V was applied to the source and drain electrodes and the source-drain current Ids versus gate voltage Vg was measured and shown in FIGS. 12, 13, and 14.

Referring to FIGS. 9 through 11, in the thin-film transistors with the structures of Examples 1 through 3, when a voltage of 0.1 V was applied to the source and drain electrodes, the drain current Ids was under 1.0E-13, which means that the off characteristics are excellent.

Referring to FIGS. 12 through 14, in the thin-film transistors with the structures of Examples 1 through 3, when a voltage of 10 V was applied to the source and drain electrodes, the drain current Ids was under 1.0E-13, which means that the thin-film transistors of Examples 1 and 2 have excellent off characteristics. On the other hand, in the thin-film transistor of Example 3, in which case the lower protective metal layer overlaps the channel region, lightly doped regions, and source-drain regions of the semiconductor layer and has a smaller width than the semiconductor layer, it was observed that the off current was close to 1.0E-10 and the off characteristics were deteriorated.

From the results of Test 1, in the case of the thin-film transistors with the connecting structure between the gate electrode and the lower protective metal layer, it can be concluded that, when the lower protective metal layer overlaps the channel region, lightly doped regions, and source and drain regions of the semiconductor layer, the off current increases a lot and the off characteristics of the thin-film transistors are deteriorated. Accordingly, in forming a thin-film transistor with the connecting structure between the gate electrode and the lower protective metal layer, an embodiment of the present invention can reduce or prevent deterioration of the off characteristics of the thin-film transistor by forming the thin-film transistor in such a way that the lower protective metal layer overlaps the channel region and lightly doped regions of the semiconductor layer but does not overlap the source and drain regions.

Test 2: Measurement of Characteristics of Thin-Film Transistor with Connecting Structure Between Source Electrode and Lower Protective Metal Layer Example 4

A thin-film transistor with the structure of FIG. 7 was fabricated. Here, the overlap distance X4 between the lower protective metal layer and the lightly doped regions was 1.5 µm, and the width W3 of each lightly doped region was 1 µm.

Example 5

A thin-film transistor with the structure of FIG. 7 was fabricated. Here, the overlap distance X4 between the lower protective metal layer and the lightly doped regions was 1 µm, and the width W3 of each lightly doped region was 1.5 µm.

Example 6

A thin-film transistor with the structure of FIG. 8 in which the width of the lower protective overlaps the source and drain regions was fabricated. Here, the overlap distance (not shown) between the lower protective metal layer and the lightly doped regions and source region was 2 µm, and the width W3 of each lightly doped region was 1 µm.

Figure 15:
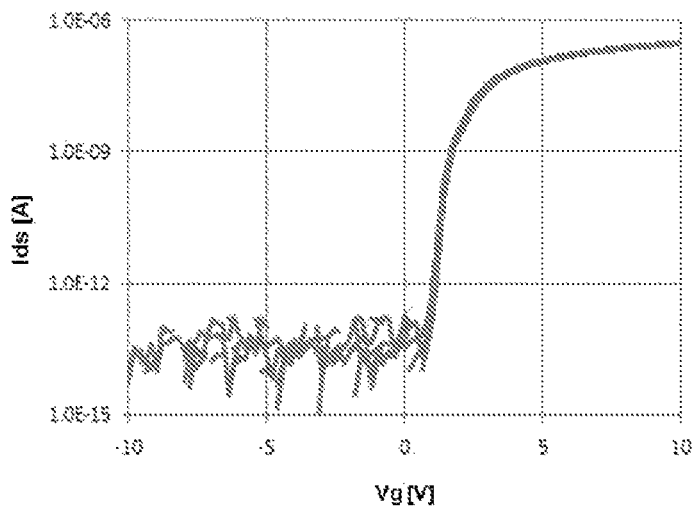
FIG. 15 is a graph of the source-drain current Ids versus gate voltage Vg which is measured upon application of a voltage of 0.1 V to the source and drain electrodes of a thin-film transistor fabricated according to Example 4 of the present invention.
Figure 16:
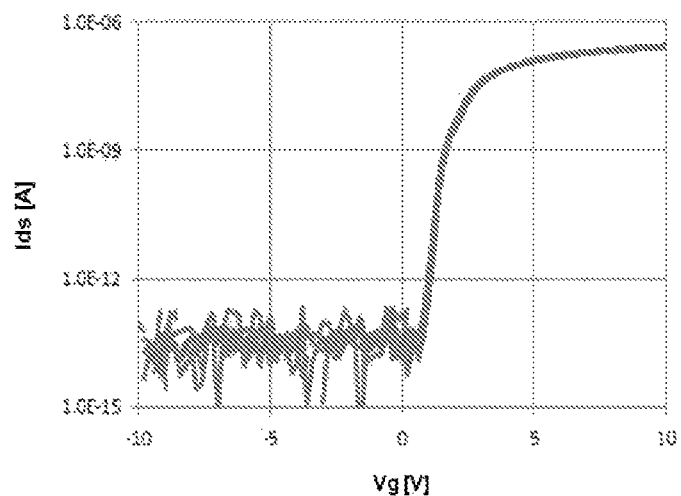
FIG. 16 is a graph of the source-drain current Ids versus gate voltage Vg which is measured upon application of a voltage of 0.1 V to the source and drain electrodes of a thin-film transistor fabricated according to Example 5 of the present invention.
Figure 17:
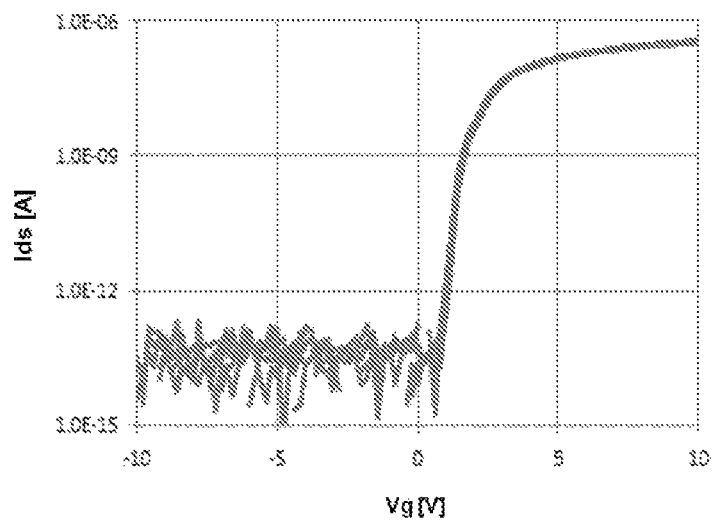
FIG. 17 is a graph of the source-drain current Ids versus gate voltage Vg which is measured upon application of a voltage of 0.1 V to the source and drain electrodes of a thin-film transistor fabricated according to Example 6 of the present invention.
Figure 18:
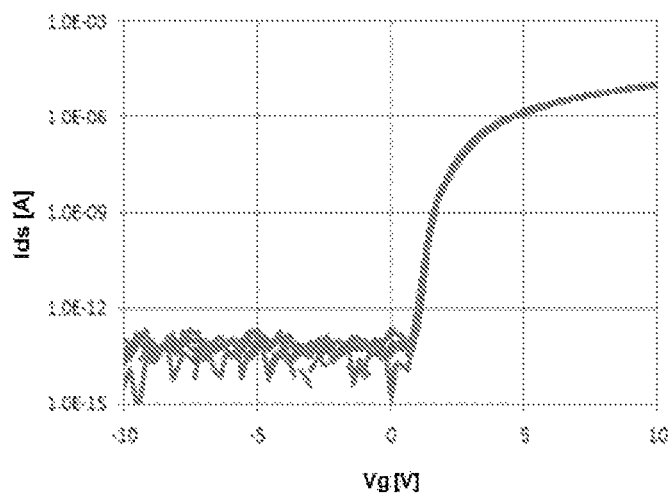
FIG. 18 is a graph of the source-drain current Ids versus gate voltage Vg which is measured upon application of a voltage of 10 V to the source and drain electrodes of a thin-film transistor fabricated according to Example 4 of the present invention.
Figure 19:
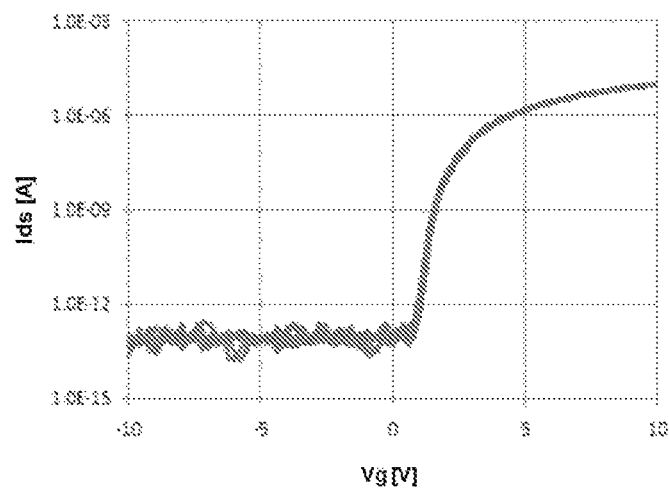
FIG. 19 is a graph of the source-drain current Ids versus gate voltage Vg which is measured upon application of a voltage of 10 V to the source and drain electrodes of a thin-film transistor fabricated according to Example 5 of the present invention.
Figure 20:
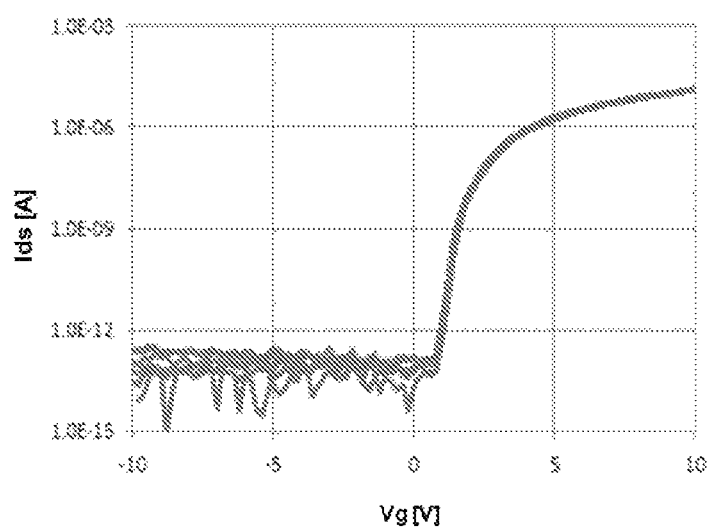
FIG. 20 is a graph of the source-drain current Ids versus gate voltage Vg which is measured upon application of a voltage of 10 V to the source and drain electrodes of a thin-film transistor fabricated according to Example 6 of the present invention.

In the thin-film transistors fabricated according to the aforementioned Examples 4 through 6, a voltage of 0.1 V was applied to the source and drain electrodes and the source-drain current Ids versus gate voltage Vg was measured and shown in FIGS. 15, 16, and 17, and a voltage of 10 V was applied to the source and drain electrodes and the source-drain current Ids versus gate voltage Vg was measured and shown in FIGS. 18, 19, and 20.

Referring to FIGS. 15 through 17, in the thin-film transistors with the structures of Examples 4 through 6, when a voltage of 0.1 V was applied to the source and drain electrodes, the drain current Ids was under 1.0E-13, which means that the off characteristics are excellent.

Referring to FIGS. 18 through 20, in the thin-film transistors with the structures of Examples 4 through 6, when a voltage of 10 V was applied to the source and drain electrodes, the drain current Ids was under 1.0E-13, which means that the off characteristics are excellent.

From the results of Test 2, in the case of the thin-film transistors with the connecting structure between the source electrode and the lower protective metal layer, it can be concluded that the lower protective metal layer does not overlap the lightly doped regions of the semiconductor layer, and even if it overlaps the lightly doped regions or the source and drain regions, the off characteristics are excellent. Accordingly, in forming a thin-film transistor with the connecting structure between the source electrode and the lower protective metal layer, an embodiment of the present invention can reduce or prevent deterioration of the characteristics of the thin-film transistor by forming the thin-film transistor in such a way that the size of the lower protective metal layer varies in the extent to which the lower protective metal layer has a smaller width than the semiconductor layer.

The following Table 1 summarizes the production yields of a display device with a thin-film transistor with the structure of the above Example 3 of Test 1 and a display device with a thin-film transistor with the structure of the above Example 6 of Test 2.

TABLE 1

|  |  | Example 3 | Example 6 |
|---|---|---|---|
| TFT | Stain defect caused by luminance variation | 11.6 | 0.8 |
|  | Dark spots (%) | 27.0 | 0.9 |
|  | Operating defect | 11.3 | 1.5 |
| OLED | Stain defect | 11.3 | 4.1 |

Referring to Table 1, the production yield of the display device with a thin-film transistor of Example 3 in which the gate electrode and the lower protective metal layer are connected showed a 10.8% increase in stain defect caused by luminance variation, a 26.1% increase in dark spots, a 9.8% increase in operating defect, and a 7.2% increase in stain defect.

From these results, in cases where the lower protective metal layer overlaps the channel region, lightly doped regions, and source and drain regions of the semiconductor layer and has a smaller width than the semiconductor layer, it can be concluded that many artifacts occur due to deterioration of the off characteristics of the thin-film transistor.

As discussed above, a display device according to an exemplary embodiment of the present invention comprises a lower protective metal layer in order to reduce the off current of thin-film transistors and prevent hot-carrier generation. In forming a thin-film transistor with the connecting structure between the gate electrode and the lower protective metal layer, an embodiment of the present invention can reduce or prevent deterioration of the off characteristics of the thin-film transistor by forming the thin-film transistor in such a way that the lower protective metal layer overlaps the channel region and lightly doped regions of the semiconductor layer but does not overlap the source and drain regions.

Moreover, in forming a thin-film transistor with the connecting structure between the source electrode and the lower protective metal layer, an embodiment of the present invention can reduce or prevent deterioration of the characteristics of the thin-film transistor by forming the thin-film transistor in such a way that the size of the lower protective metal layer varies in the extent to which the lower protective metal layer has a smaller width than the semiconductor layer.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin-film transistor substrate comprising:
    a lower protective metal layer on a substrate;
    a buffer layer on the lower protective metal layer;
    a semiconductor layer on the buffer layer and comprising a channel region, lightly doped regions, a source region, and a drain region;
    a first insulating film on the semiconductor layer;
    a gate electrode on the first gate insulating film and electrically connected to the lower protective metal layer;
    a second insulating film on the gate electrode;
    source and drain electrodes on the second insulating film and electrically connected to the source and drain regions; and
    a first electrode electrically connected to the drain region,
    wherein the lower protective metal layer overlaps the channel region of the semiconductor layer.

2. The thin-film transistor substrate of claim 1, wherein the lower protective metal layer overlaps the channel region of the semiconductor layer and does not overlap the lightly doped regions.

3. The thin-film transistor substrate of claim 1, wherein the width of the lower protective metal layer is smaller than the width of the channel region of the semiconductor layer.

4. The thin-film transistor substrate of claim 1, wherein the lower protective metal layer overlaps the channel region and lightly doped regions of the semiconductor layer and does not overlap the source and drain regions.

5. The thin-film transistor substrate of claim 1, wherein the width of the lower protective metal layer is larger than the width of the channel region and smaller than the sum of the width of the channel region and the widths of the lightly doped regions.

6. A thin-film transistor substrate comprising:
    a lower protective metal layer on a substrate;
    a buffer layer on the lower protective metal layer;
    a semiconductor layer on the lower protective metal layer and comprising a channel region, lightly doped regions, a source region, and a drain region;
    a first insulating film on the semiconductor layer;
    a gate electrode on the first gate insulating film;
    a second insulating film on the gate electrode;

a drain electrode on the second insulating film and electrically connected to the drain region; and
a source electrode electrically connected to the source region and the lower protective metal layer,
wherein the lower protective metal layer overlaps the channel region of the semiconductor layer.

7. The thin-film transistor substrate of claim 6, wherein the lower protective metal layer overlaps the channel region of the semiconductor layer and does not overlap the lightly doped regions.

8. The thin-film transistor substrate of claim 6, wherein the width of the lower protective metal layer is smaller than the width of the channel region of the semiconductor layer.

9. The thin-film transistor substrate of claim 6, wherein the lower protective metal layer overlaps the channel region and lightly doped regions of the semiconductor layer and does not overlap the source and drain regions.

10. The thin-film transistor substrate of claim 6, wherein the width of the lower protective metal layer is larger than the width of the channel region and smaller than the sum of the width of the channel region and the widths of the lightly doped regions.

11. The thin-film transistor substrate of claim 6, wherein the lower protective metal layer overlaps the channel region of the semiconductor layer, the lightly doped regions, the source region, and the drain region.

12. The thin-film transistor substrate of claim 6, wherein the width of the lower protective metal layer is smaller than the overall width of the semiconductor layer and larger than the sum of the width of the channel region and the widths of the lightly doped regions.

13. A thin-film transistor substrate comprising:
a lower protective metal layer on a substrate;
a buffer layer on the lower protective metal layer;
a semiconductor layer on the buffer layer and comprising a channel region, lightly doped regions, a source region, and a drain region;
a first insulating film on the semiconductor layer;
a gate electrode on the first gate insulating film and electrically connected to the lower protective metal layer;
a second insulating film on the gate electrode;
source and drain electrodes on the second insulating film and electrically connected to the source and drain regions;
a first electrode electrically connected to the drain region;
an organic layer on the first electrode; and
a second electrode on the organic layer,
wherein the lower protective metal layer overlaps the channel region of the semiconductor layer.

14. A thin-film transistor substrate comprising:
a lower protective metal layer on a substrate;
a buffer layer on the lower protective metal layer;
a semiconductor layer on the lower protective metal layer and comprising a channel region, lightly doped regions, a source region, and a drain region;
a first insulating film on the semiconductor layer;
a gate electrode on the first gate insulating film;
a second insulating film on the gate electrode;
a drain electrode on the second insulating film and electrically connected to the drain region;
a source electrode electrically connected to the source region and the lower protective metal layer,
an organic layer on the first electrode; and
a second electrode on the organic layer
wherein the lower protective metal layer overlaps the channel region of the semiconductor layer.

* * * * *